(12) United States Patent
Tsai

(10) Patent No.: US 10,299,329 B2
(45) Date of Patent: May 21, 2019

(54) LIGHT STRING CONTROLLING CIRCUIT FOR SINGLE NODE AND METHOD THEREOF

(71) Applicant: Cosmo Lighting Inc., Walnut, CA (US)

(72) Inventor: Nai-Chen Tsai, New Taipei (TW)

(73) Assignee: COSMO LIGHTING INC., Walnut, CA (US)

( * ) Notice: Subject to any disclaimer, the term of this patent is extended or adjusted under 35 U.S.C. 154(b) by 0 days.

(21) Appl. No.: 16/059,877

(22) Filed: Aug. 9, 2018

(65) Prior Publication Data

US 2019/0104576 A1    Apr. 4, 2019

Related U.S. Application Data

(60) Provisional application No. 62/584,619, filed on Nov. 10, 2017, provisional application No. 62/565,327, filed on Sep. 29, 2017.

(51) Int. Cl.
*H05B 33/08* (2006.01)
*H05B 37/02* (2006.01)

(52) U.S. Cl.
CPC ....... *H05B 33/083* (2013.01); *H05B 33/0845* (2013.01)

(58) Field of Classification Search
None
See application file for complete search history.

(56) References Cited

U.S. PATENT DOCUMENTS

2006/0132065 A1*  6/2006  Sears ................. H05B 37/0254
                                                                    315/312

* cited by examiner

*Primary Examiner* — Dedei K Hammond
(74) *Attorney, Agent, or Firm* — Li & Cai Intellectual Property (USA) Office

(57) ABSTRACT

A light string controlling circuit for single node and a method thereof are provided. The light string controlling circuit for single node includes a plurality of light-emitting elements, a power source element, a master controller and a plurality of single-node controllers. The master controller outputs a power supplying request to the power source element to instruct the power source element to supply power to the plurality of light-emitting elements sequentially. The plurality of single-node controllers are connected to the plurality of light-emitting assemblies respectively, and each of the single-node controllers outputs an emission control signal to control the luminous state of the corresponding light-emitting assemblies.

10 Claims, 7 Drawing Sheets

LIGHT STRING CONTROLLING CIRCUIT FOR SINGLE NODE AND METHOD THEREOF

FIELD OF THE DISCLOSURE

The present disclosure involves a light strip controlling circuit and a controlling method thereof, and more particularly to a light string controlling circuit and a light string controlling method for individually controlling light-emitting elements at the different wire segments.

BACKGROUND OF THE DISCLOSURE

With the development of light strips for use in the lighting industry, lighting technologies, in particular that of common light emitting diode (LED) light strips, are continuously improved as developers strive for perfection. While lamps have conventionally been used individually, more and more LED light strings are used together in public places such as corridors, underground garages and bathrooms. A driving control circuit is an important element of the LED light strings for controlling the LED light strings to operate normally. However, the conventional LED light string is controlled by a single main control element resulting in a monotonous lighting effect. Furthermore, the single master component cannot solve the problem of power being slightly or significantly attenuated during the transmission process of the power between circuit elements, resulting in the light-emitting diodes of the light strings being unable to illuminate normally, for example, an actual luminance being lower than a desired luminance.

SUMMARY OF THE DISCLOSURE

An object of the present disclosure is to provide a single-node light string controlling circuit for solving the problem that the conventional light string circuit only has a single illumination effect and cannot emit light having a desired brightness.

The present disclosure provides a light string controlling circuit for single node, the light string controlling circuit includes a plurality of light-emitting assemblies, a power source element, a master controller and a plurality of single-node controllers.

The plurality of light-emitting assemblies are connected to each other. The power source element is connected to the plurality of light-emitting assemblies and configured to supply power sequentially to the plurality of light-emitting assemblies. The master controller is connected to the power source element and configured to output a power supplying request to the power source element to instruct the power source element to supply the power. The plurality of single-node controllers are connected to the plurality of light-emitting assemblies respectively, and each of the single-node controllers is configured to output an emission control signal for controlling each of the corresponding light-emitting assemblies.

The present disclosure provides a light string controlling method for single node, the method includes the following steps: outputting a power supplying request from a master controller to a power source element; supplying power from the power source element sequentially to a plurality of light-emitting assemblies according to the power supplying request; and outputting a plurality of emission control signals respectively by a plurality of single-node controllers to control luminous states of the plurality of light-emitting assemblies.

As described above, the present disclosure has the following advantages:

1. The luminous states of the plurality of light strips are controlled respectively, or the luminous states of the plurality of light-emitting assemblies at different wire segments of the same light strip are controlled respectively. Therefore, the plurality of light-emitting assemblies of light strips are able to meet a user's expectation of exhibiting more diversified luminous effects.

2. The brightness of the one or more light-emitting elements such as light-emitting diodes of each of the light strips can be controlled precisely, and when the brightness of the light-emitting elements is too low, the power supplied to them can be appropriately compensated, for example, such that the light-emitting elements have the same brightness, and that excessive power attenuation during transmission can be avoided so that the light-emitting element can emit light normally, regardless of the complexity of the wires and the components in the circuit layout, and the configuration relationship between the strings and the power source element such as a power supply, a current source or a voltage source, etc.

DETAILED DESCRIPTION OF THE EXEMPLARY EMBODIMENTS

Figure 1:
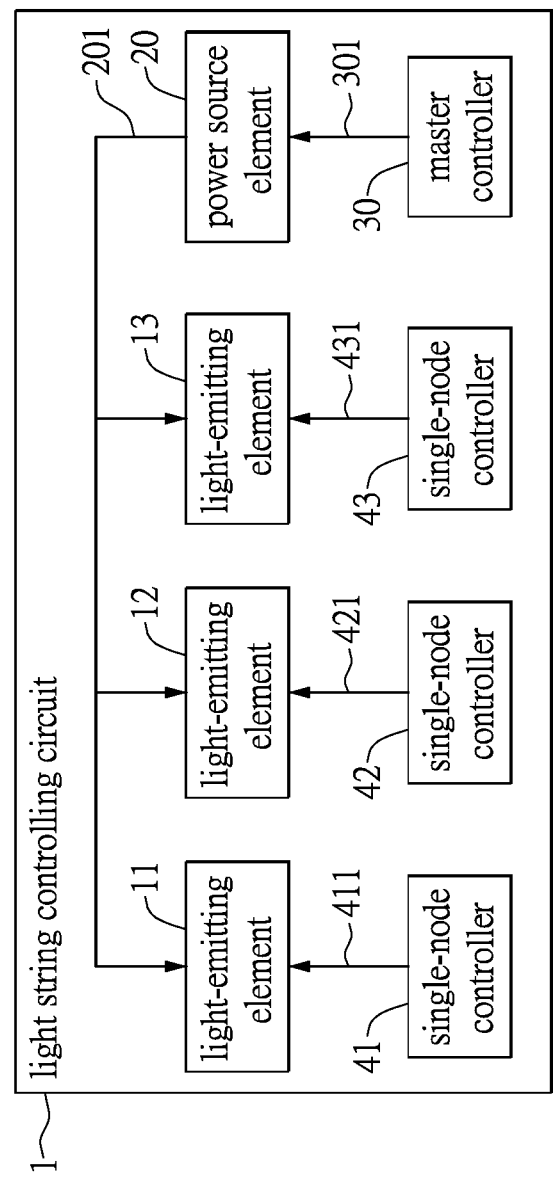
FIG. 1 is a block diagram of a first embodiment of a light string controlling circuit for single node according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1, a block diagram of a first embodiment of a light string controlling circuit for single node according to the present disclosure is shown. As shown in FIG. 1, the light string controlling circuit 1 includes a plurality of light-emitting assemblies 11 to 13, a power source element 20, a master controller 30 and a plurality of single-node controllers 41 to 43. The single-node controller 41 is electrically connected to the light-emitting element 11. The single-node controller 42 is electrically connected to the light-emitting element 12. The single-node controller 43 is electrically connected to the light-emitting element 13. The power source element 20 is electrically connected between the master controller 30 and the light-emitting assemblies 11 to 13.

The master controller 30 may be a microprocessor. The master controller 30 is configured to output a power supplying request 301 to the power source element 20 to instruct the power source element 20 to supply the power 201 to the light-emitting assemblies 11 to 13 such that the light-emitting assemblies 11 to 13 can emit light.

The light-emitting assemblies 11 to 13 may have different luminous effects. The single-node controller 41 may output an emission control signal 411 to the corresponding light-emitting element 11 to control a luminous state of the light-emitting element 11 individually. The single-node controllers 42 and 43 may output emission control signals 421 and 431 to control luminous states of the light-emitting assemblies 12 and 13, respectively, such as brightness, a color, a lighting time, a frequency and other features. The light-emitting assemblies 11 to 13 may be synchronously or asynchronously controlled by the single-node controllers 41 to 43. The single-node controllers 41 to 43 may be a microprocessor that operates independently from the master controller 30.

As described in the above, in the embodiment of the present disclosure, the master controller is only configured to control the power source element to supply the power, but not to directly control the luminous state of the light-emitting assemblies. It is worth noting that each of the single-node controllers is individually configured to independently control each of the light-emitting assemblies. Additionally or alternatively, the same single-node controller may be configured for controlling two or more light-emitting assemblies which are adjacent to each other. For example, only the single-node controllers 41 and 43 are disposed in the circuit layout, wherein the single-node controller 41 is configured to control the light-emitting assemblies 11 and 12 and the single-node controller 43 is configured to control the light-emitting element 13. The plurality of single-node controllers may be selectively connected to the plurality of light-emitting assemblies. The single-node controllers may set the corresponding light-emitting elements to respectively have different parameters.

Figure 2:
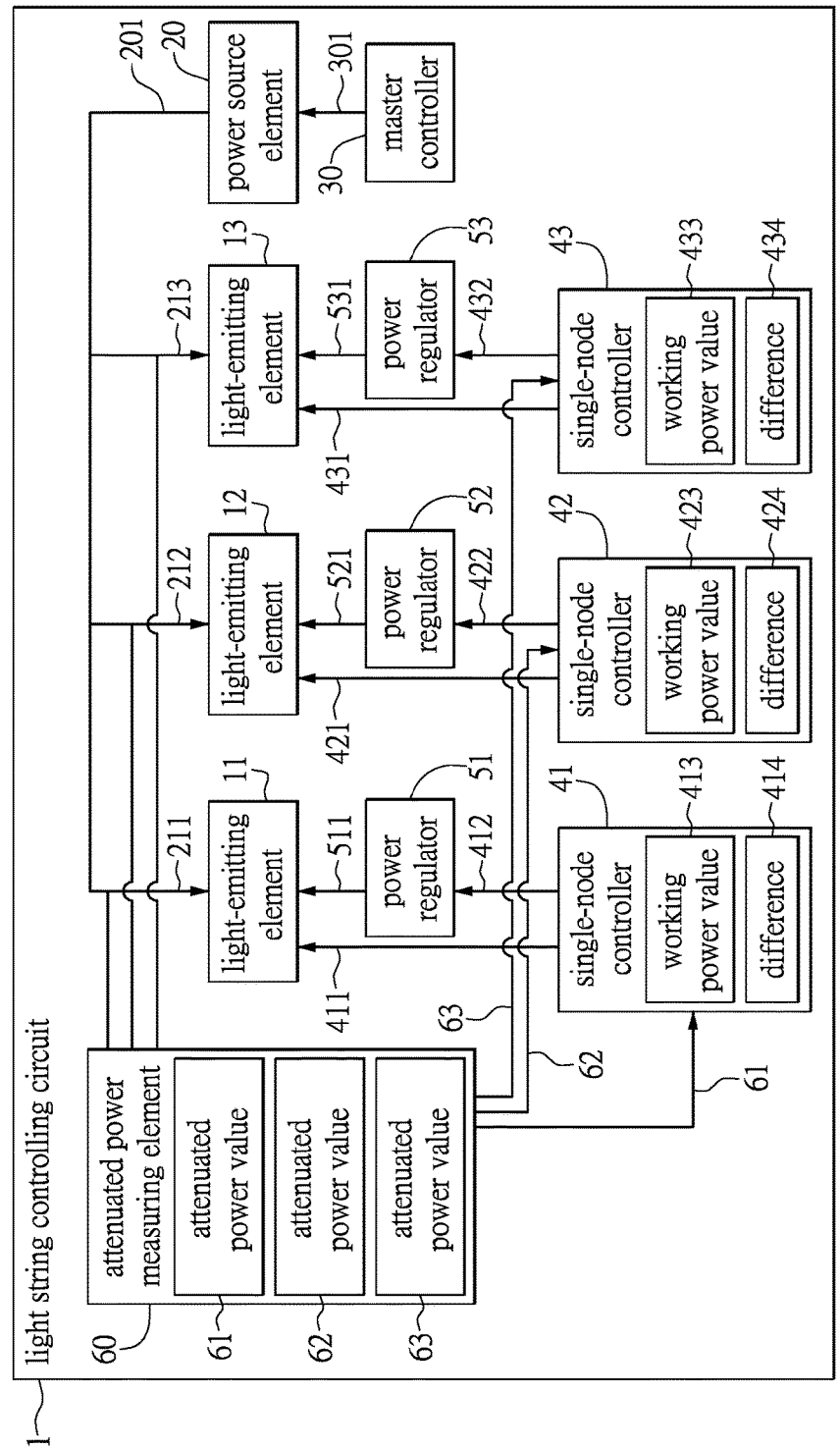
FIG. 2 is a block diagram of a second embodiment of a light string controlling circuit for single node according to the present disclosure.

Referring to FIG. 2, a block diagram of a second embodiment of a light string controlling circuit for single node according to the present disclosure is shown. As shown in FIG. 2, the light string controlling circuit 1 further includes power regulators 51 to 53 and an attenuated power measuring element 60.

First, the power source element 20 outputs the power 201 in response to the power supplying request 301 outputted by the master controller 30. In practice, the power 201 may be attenuated slightly or significantly during the process in which the power 201 is supplied from the power source element 20 to the light-emitting assemblies 11 to 13, where a degree of the power attenuation is dependent on the different circuit designs or other factors. As shown in FIG. 2, the power 201 is attenuated to form attenuated power 211 to 213 before passing through the light-emitting assemblies 11 to 13 respectively. The attenuated power 211 to 213 may be different from each other due to differences in configuration between the light-emitting elements 11 to 13 and the power source element 20.

Hereinafter, it is assumed that all of the light-emitting elements 11 to 13 in the circuit layout have the same characteristics. When the power source element 20 supplies the same current to the light-emitting elements 11 to 13 connected in series to each other, the light-emitting assemblies 11 to 13 should ideally emit light having the same brightness. However, in practice, although the current received by some of the light-emitting elements such as the light-emitting element 13 disposed close to the power source element 20 is not attenuated, the current received by the light-emitting assemblies 11 and 12 disposed far away from the power source element 20 may be attenuated to be smaller than the original current, for example, due to the reason that the current flows through the plurality of electronic components before reaching the light-emitting assemblies 11 and 12. The current attenuation phenomenon causes the light-emitting assemblies 11 to 13 to have different brightness when the same current is supplied to each of the light-emitting assemblies 11 to 13 connected in series to each other. Therefore, a desired effect of emitting light having the same brightness by the light-emitting assemblies 11 to 13 cannot be achieved when the same current is supplied to them. The attenuated power 201 may be smaller than a working current or a working voltage of each of the light-emitting assemblies 11 to 13, so that the light-emitting assemblies 11 to 13 cannot emit light.

To solve the above problem, in an embodiment of the present disclosure, the pins of the attenuated power measuring element 60 is contacted with the wire segments extending from the power source element 20 to the light-emitting assemblies 11 to 13. The attenuated power measuring element 60 is configured to measure attenuated power values 61 to 63 such as voltage values or current values of the attenuated power 211 to 213 formed after the power 201 passes through the wire segments, wherein the attenuated power values 61 to 63 may be the same or different from each other. It should be noted that the main object is to achieve a desired luminous effect even if attenuation occurs. For convenience of explanation, as used herein, the term "power" refers to the power 201 supplied by the power source element 20, and the term "attenuated power" refers to the attenuated power 211 to 213 formed after the power 201 passes through the wire segments and the electrical elements. However, it should be understood by one skilled in the art that the power 201 may not be attenuated when the light-emitting element is disposed close to the power source element 20 and the power 201 does not pass through other electric electronic components. In this case, the attenuated power values 63 of the attenuated power 213 received by the light-emitting assemble 13 is the same as the power 201 supplied by the power source element 20.

The attenuated power measuring element 60 may be an AC/DC current sensor such as ACS717 or ACS718 current sensor, an AC/DC voltage sensor, or other measuring elements such as a multimeter for measuring both a voltage and a current, etc.

The attenuated power values 61 to 63 of the attenuated power 211 to 213 that are measured by the attenuated power measuring element 60 are sequentially or simultaneously supplied to the single-node controller 41 to 43 for controlling the light-emitting assemblies 11 to 13 respectively. The single-node controllers 41 to 43 determine the adjustment of the attenuated power 211 to 213 respectively according to the measurement results of the attenuated power measuring element 60. More specifically, the single-node controllers 41 to 43 store working power values 413, 423 and 433 of the light-emitting assemblies 11 to 13 respectively, wherein the single-node controller 41 stores the working power value 413 of the light-emitting element 11. The single-node controllers 41 to 43 receive the attenuated power values 61 to 63 from the attenuated power measuring element 60 respectively. The single-node controller 41 calculates a difference 414 between the attenuated power value 61 and the initial power 201 supplied by the power source element 20. The single-node controller 42 calculates a difference 424 between the attenuated power value 62 and the initial power 201. The single-node controller 43 calculates a difference 434 between the attenuated power value 63 and the initial power 201.

When the single-node controller 41 determines that the attenuated power value 61 is smaller than the working power value 413 of the light-emitting element 11, the single-node controller 41 outputs a power adjusting signal 412 to instruct the power regulator 51 to adjust the attenuated power 211 based on the working power value 413 and the initial power 201 supplied by the power source element 20 to generate a single-node adjusted power 511. When the single-node controller 42 determines that the attenuated power value 62 is smaller than the working power value 423 of the light-emitting element 12, the single-node controller 42 outputs a power adjusting signal 422 to instruct the power regulator 52 to adjust the attenuated power 212 based on the working power value 423 and the initial power 201 to generate a single-node adjusted power 521. When the single-node controller 43 determines that the attenuated power value 63 is smaller than the working power value 433 of the light-emitting element 13, the single-node controller 43 outputs a power adjusting signal 433 to instruct the power regulator 53 to adjust the attenuated power 213 based on the working power value 433 and the initial power 201 to generate a single-node adjusted power 531. For example, the single-node controller 41 controls the power regulator 51 to generate the single-node adjusted power 511 that is larger than the working power value 413 of the light-emitting element 11 and even equal to the power 201. The single-node adjusted power 511, 521, 531 may be the same, for example, each being equal to the power 201, or different from each other. The power regulators 51 to 53 then supply the single-node adjusted power 511, 521, 531 to the light-emitting assemblies 11 to 13 respectively. Therefore, in the embodiment, each of the plurality of light-emitting assemblies of the light strip controlling circuit may be individually controlled such that the plurality of light-emitting assemblies emit light synchronously or asynchronously based on a time sequence to exhibit more diversified luminous effects to meet a user's requirement, Furthermore, the brightness of the light-emitting elements can be precisely controlled and the power can be prevented from being attenuated excessively, resulting in undesired emission of the light-emitting assemblies regardless of the configuration complexity of the wires and the components in the circuit layout, Referring to FIG. 3, a block diagram of a third embodiment of a light string controlling circuit for single node according to the present disclosure is shown. In order to more accurately and quickly adjust the luminance of the light-emitting assemblies 11 to 13, the single-node controllers 41 to 43 may store parameters of the circuit layout in advance. For example, the single-node controller 41 may store a current path length 415 of the wire segments through which the power 201 passes from the power source element 20 to the light-emitting element 11, wherein the power 201 may be attenuated into the attenuated power 211 during transmission. The single-node controller 42 may store a current path length 425 of the wire segments through which the power 201 passes from the power source element 20 to the light-emitting element 12, wherein the power 201 may be attenuated into the attenuated power 212. The single-node controller 43 may store a current path length 435 of the wire segments through which the power 201 passes from the power source element 20 to the light-emitting element 13, wherein the power 201 may be attenuated into the attenuated power 213.

The single-node controller 41 receives the attenuated power value 61 of the attenuated power 211 that is measured at a wire segment between the power source element 20 and the light-emitting element 11. The single-node controller 41 then calculates a difference 414 between the attenuated power 211 and the power 201, and analyzes a ratio 416 of the current path length 415 and the difference 414 to determine a degree in which the power 201 is attenuated to the attenuated power 211 in a circuit layout with a specific wire segment length, and accordingly adjusts the circuit layout.

The single-node controller 42 receives the attenuated power value 62 of the attenuated power 212 that is measured at a wire segment between the power source element 20 and the light-emitting element 12. The single-node controller 42 then calculates a difference 424 between the attenuated power 212 and the power 201, and analyzes a ratio 426 of the current path length 425 and the difference 424 to determine a degree in which the power 201 is attenuated to the attenuated power 212 in a circuit layout with a specific wire segment length and accordingly adjusts the circuit layout.

Figure 3:
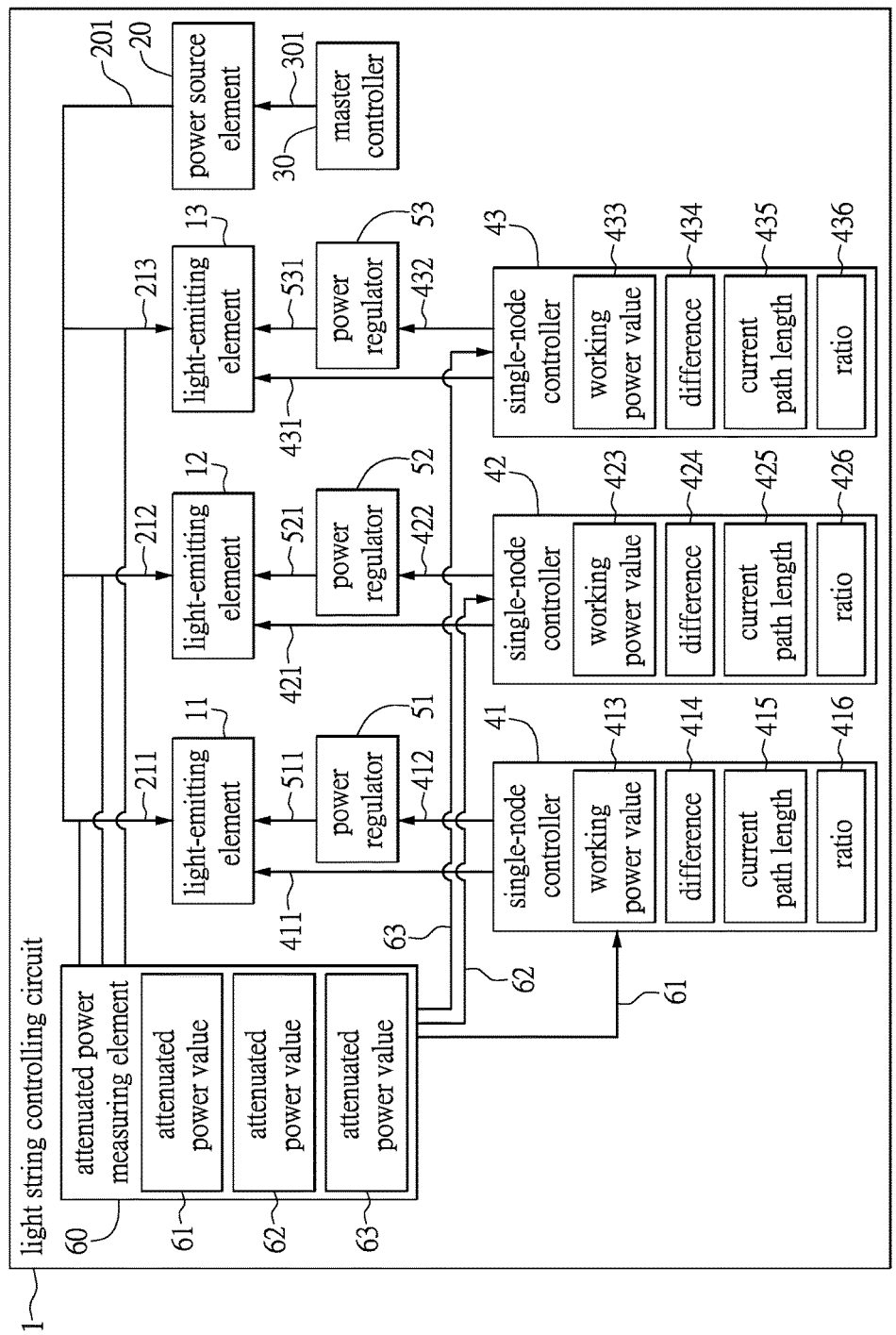
FIG. 3 is a block diagram of a third embodiment of a light string controlling circuit for single node according to the present disclosure.

The single-node controller 43 receives the attenuated power value 63 of the attenuated power 213 that is measured at a wire segment between the power source element 20 and the light-emitting element 13. The single-node controller 43 then calculates a difference 434 between the attenuated power 213 and the power 201, and analyzes a ratio 436 of the current path length 435 and the difference 434 to determine a degree in which the power 201 is attenuated to the attenuated power 213 in a circuit layout with a specific wire segment length and accordingly adjusts the circuit layout. Further, the single-node controllers 41 to 43 may determine how much initial power needs to be supplied by the power source element 201 and how much amplitude of the attenuated power 211 to 213 need to be adjusted by the single-node controllers 41 to 43 respectively when the light-emitting assemblies 11 to 13 are next driven to emit light according to the attenuated amplitude of the attenuated power 211 to 213 in the same circuit layout having the same light-emitting assemblies 11 to 13 and other same elements. For example, as shown in FIG. 3, the current path length 415 between the power source element 20 and the light-emitting element 11 is larger than the current path length 435 between the power source element 20 and the light-emitting element 13. As a result, the difference 414 between the attenuated power value 61 of the attenuated power 211 before passing through the light-emitting element 11 and the power 201 value is larger than the difference 434 between the attenuated power value 63 of the attenuated power 213 before passing through the light-emitting element 13 and the power 201.

If it is desired to adjust each of the attenuated power 211, 213 to have the same power value as the power 201, an adjustment amplitude of the attenuated power 211 by the single-node controller 41 is larger than an adjustment amplitude of the attenuated power source element 213 by the single-node controller 43.

Figure 4:
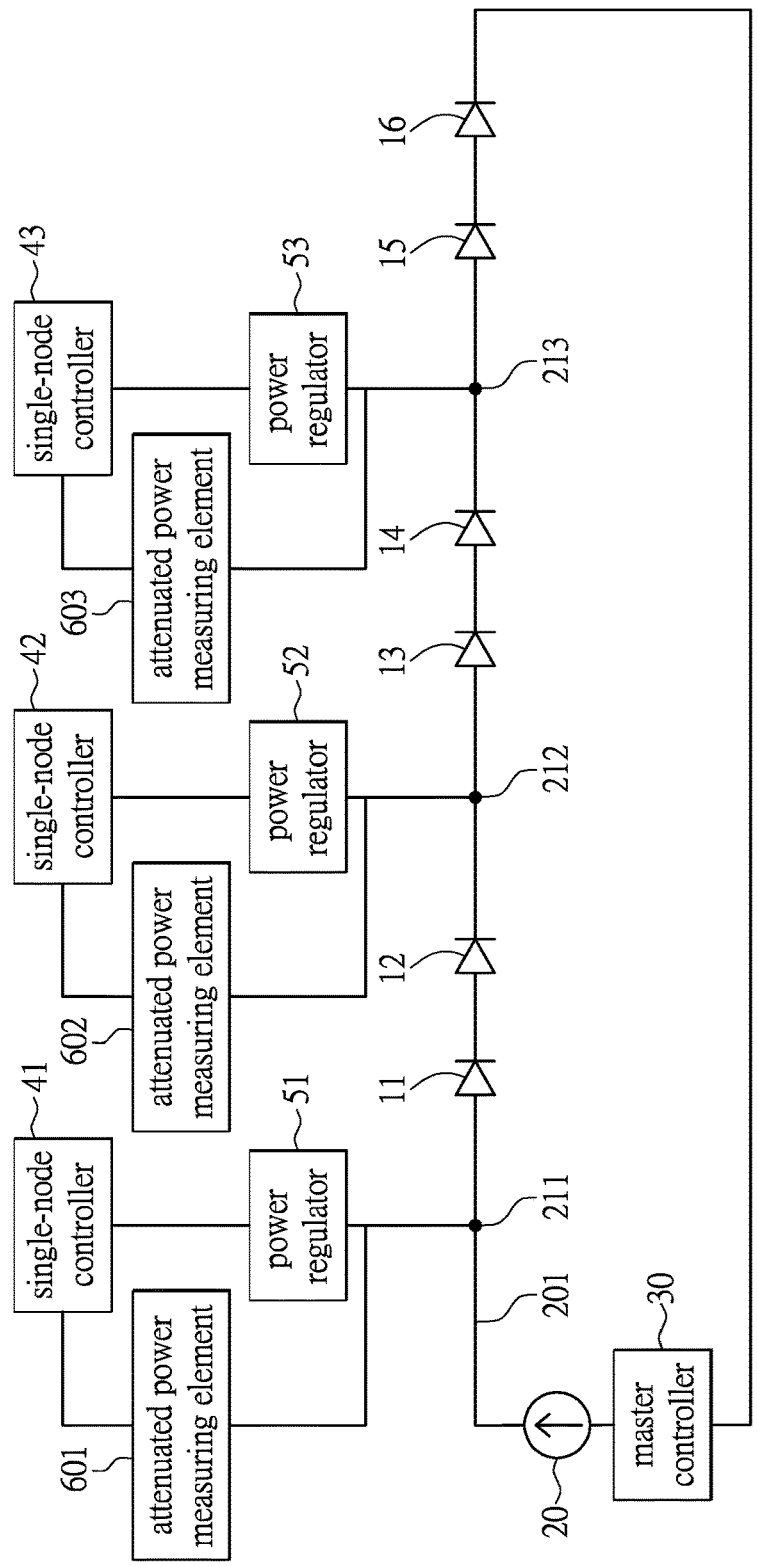
FIG. 4 is a circuit layout diagram of a fourth embodiment of a light string controlling circuit for single node according to the present disclosure.

Referring to FIG. 4, a circuit layout diagram of a fourth embodiment of a light string controlling circuit for single node according to the present disclosure is shown. As shown in FIG. 4, the light string controlling circuit 1 further includes attenuated power measuring elements 601 to 603.

As described in the above first to third and the following fifth embodiments, a number of the single-node controllers is equal to a number of the light-emitting elements to achieve individual control of the light-emitting element by the single-node controller. In contrast, in this fourth embodiment, a number of the single-node controllers 41 to 43 is less than a number of the light-emitting elements 11 to 16, wherein the single-node controller 41 controls the two light-emitting elements 11 and 12. The number of the light-emitting elements controlled by the single-node controller may be adjusted according to circuit design requirements. The number of the light-emitting elements controlled by the single-node controller may be different from that of another single-node controller. For example, each of some of the single-node controllers controls only one light-emitting element, but each of other single-node controllers controls a plurality of light-emitting elements.

In the embodiment, the light-emitting elements 11 to 16 are all light-emitting diodes, but they may also be other electronic components having a lighting function. The light-emitting elements 11 to 16 may be connected to each other in series in the same direction via the wire. The power source element 20 is connected to a positive pin of the light-emitting element 11, and to a negative positive pin of the light-emitting element 16 via the master controller 30. The attenuated power measuring element 601 is connected between the positive pin of the light-emitting element 11 and the single-node controller 41. The attenuated power measuring element 602 is connected between the positive pin of the light-emitting element 13 and the single-node controller 42. The attenuated power measuring element 603 is connected between the positive pin of the light-emitting element 15 and the single-node controller 43. The power regulators 51 to 53 are connected to the positive pins of the light-emitting elements 11, 13 and 15 respectively. The single-node controller 41 is connected between the power regulator 51 and the attenuated power measuring element 601. The single-node controller 42 is connected between the power regulator 52 and the attenuated power measuring element 602. The single-node controller 43 is connected between the power regulator 53 and the attenuated power measuring element 603.

The master controller 30 instructs the power source element 20 to supply the power 201, for example, the power 201 flows to the light-emitting element 16 through the wires from the light-emitting element 11 and finally flows back to the power source element 20. The attenuated power measuring elements 601 to 603 are configured to measure the power 201 passing through the different wire segments before reaching each group of the light-emitting elements 1112, 1314 and 1516 respectively. Ideally, the same current (i.e., the power 201) flows through each of the light-emitting elements 11 to 16 connected to each other in series. However, the power measured at different wire segments before passing through each of the light-emitting elements is actually an attenuated power from the power 201. For convenience of description, as shown in FIG. 4, the measured power formed from the power 201 is represented by the attenuated power 211 to 213 in the embodiment. The power source element 20 may be a current source for supplying a current to each of the light-emitting elements 11 to 16, but it may also be a voltage source, a power supply and the like.

The single-node controllers 41 to 43 receive the attenuated power 211 to 213 from the attenuated power measuring elements 601 to 603 respectively. The single-node controllers 41 to 43 then determine adjustment amplitudes of the attenuated power 211 to 213 such as boosting amplitudes of currents or voltages according to the attenuated amplitude of the attenuated power 211 to 213 respectively. As shown in FIG. 4, a length of the wire segments between the light-emitting element 16 and an output terminal of the power source element 20 is larger than a length of the wire segments between the light-emitting element 11 and the output terminal of the power source element 20. As a result, the attenuated power 213 flowing toward the light-emitting elements 15 and 16 is smaller than the attenuated power 211 flowing toward the light-emitting elements 11 and 12. Therefore, a degree in which the attenuated power 213 is adjusted to equal the power 201 by the power regulator 53 is larger than a degree in which the attenuated power 211 is adjusted to equal the power 201.

Figure 5:
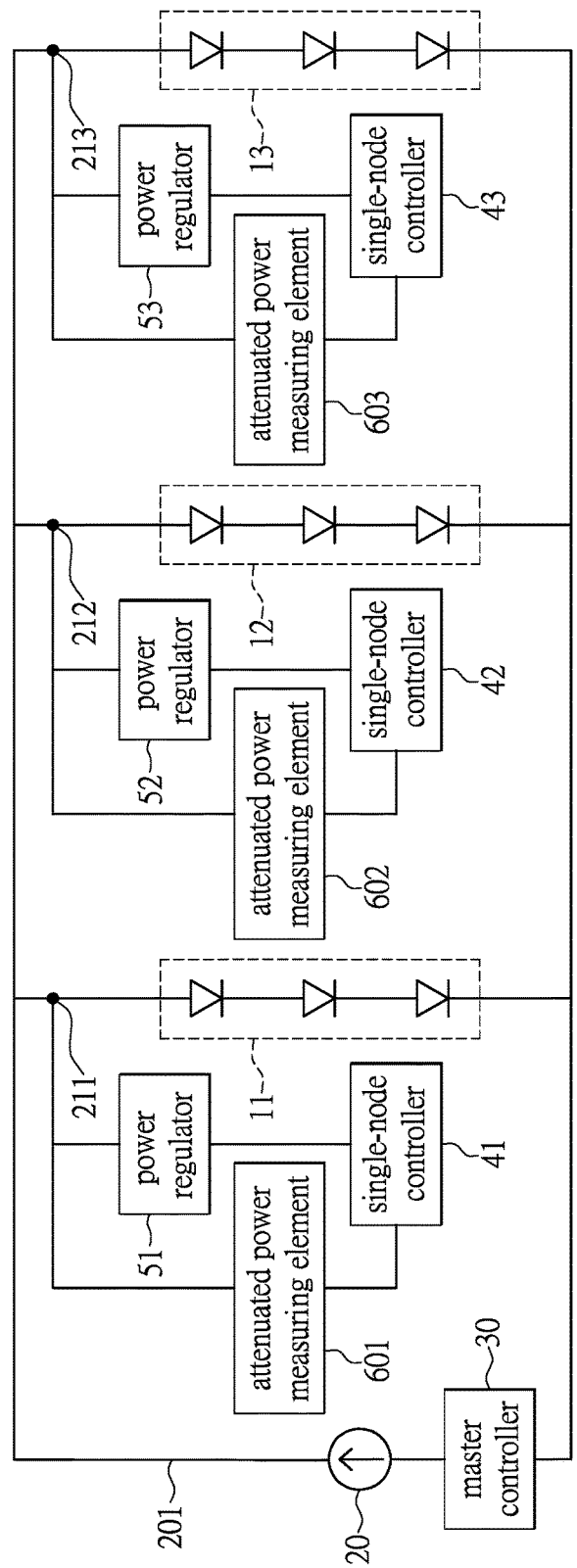
FIG. 5 is a circuit layout diagram of a fifth embodiment of a light string controlling circuit for single node according to the present disclosure.

Referring to FIG. 5, a circuit layout diagram of a fifth embodiment of a light string controlling circuit for single node according to the present disclosure is shown. The power source element 20 is connected to the positive pin of the uppermost light-emitting diode and the negative pin of the lowermost light-emitting diode among the light-emitting assemblies 11 to 13. The light-emitting assemblies 11 to 13 are connected to each other in parallel via the wire to form a plurality of light strips. Each of the light-emitting assemblies 11 to 13 may include a plurality of light-emitting diodes, a number of which may be, for example, three. The light-emitting diodes may be adjusted according to actual requirements. The attenuated power measuring elements 601 to 603 are connected to the positive pins of the uppermost light emitting diodes of the light-emitting assemblies 11 to 13 respectively, and the configuration of the power regulators 51 to 53 are also the same. The single controller 41 is connected between the power regulators 51 and the attenuated power measuring element 601. The single controller 42 is connected between the power regulators 52 and the attenuated power measuring element 602. The single controller 43 is connected between the power regulators 53 and the attenuated power measuring element 603.

Since the light-emitting assemblies 11 to 13 are connected in parallel, they should ideally emit light having the same brightness at the same voltage. However, in practice, attenuation may occur, which may cause the attenuated power 211 to 213, rather than the power 201 that is larger than each of the attenuated power 211 to 213, to be measured at the different wire segments. Therefore, in the embodiment, for example, three sets of the single-node controllers, the power regulators and the attenuated power measuring elements are provided, which measure the attenuated power 211 to 213 of the light-emitting assemblies 211 to 213, and accordingly control the light-emitting assemblies 211 to 213 to emit light, respectively.

Further, in order to make the light string controlling circuit have a desired lighting effect, each of the single-node controllers 41 to 43 may have a database. When the single-node controllers 41 to 43 receive the measurement results of the attenuated power measuring elements 601 to 603 respectively, the single-node controllers 41 to 43 looks up a connection relationship between the light-emitting assemblies 11 to 13, a connection relationship between the light-emitting elements such as light-emitting diodes of the light-emitting assemblies 11 to 13, and the working power values and the withstand power values of the light-emitting elements, from the databases of the single-node controllers 41 to 43 or of the cloud server, and the single-node controllers 41 to 43 accordingly determine a common single-node power value for the light-emitting assemblies 11 to 13. The single-node controllers 41 to 43 respectively determine the degree of adjustment of the attenuated power 211 to 213 based on the common single-node power value before the attenuated power 211 to 213 pass through the light-emitting assemblies 11 to 13. For example, the single-node controllers 41 to 43 respectively adjust the attenuated power 211 to 213 to equal the power 201, such that the light-emitting assemblies 11 to 13 emit light having the same brightness.

Figure 6:
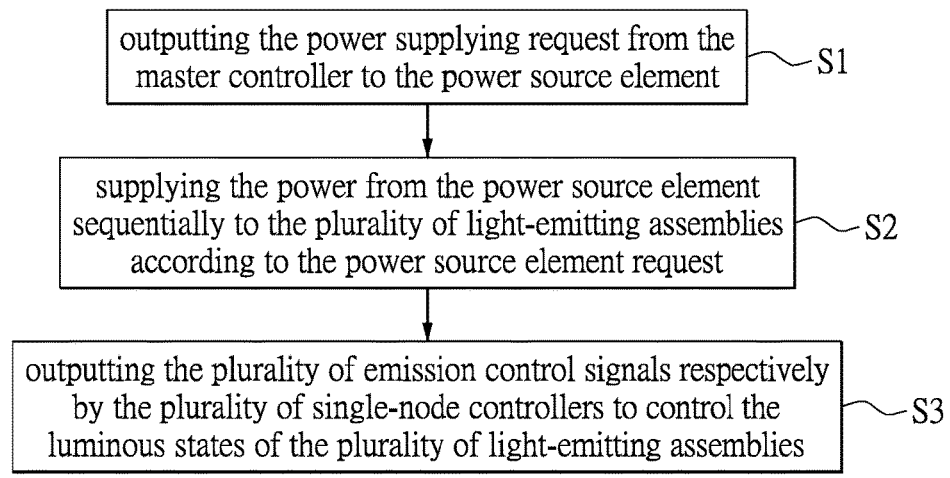
FIG. 6 is a flowchart of a first embodiment of a light string controlling method for single node according to the present disclosure.

Referring to FIG. 6, a flowchart of a first embodiment of a light string controlling method for single node according to the present disclosure is shown. As shown in FIG. 6, the light string controlling method includes the following steps S1 to S3.

In step S1, the master controller outputs the power supplying request to the power source element.

In step S2, the power source element supplies the power to the plurality of the light-emitting assemblies sequentially based on the power supplying request.

In step S3, the single-node controllers output the emission control signals to control the light-emitting assemblies to emit light at the same or different time points and exhibit diverse lighting effects in the same time interval, for example, respectively emitting a red light, a green light and a blue light, etc.

Figure 7:
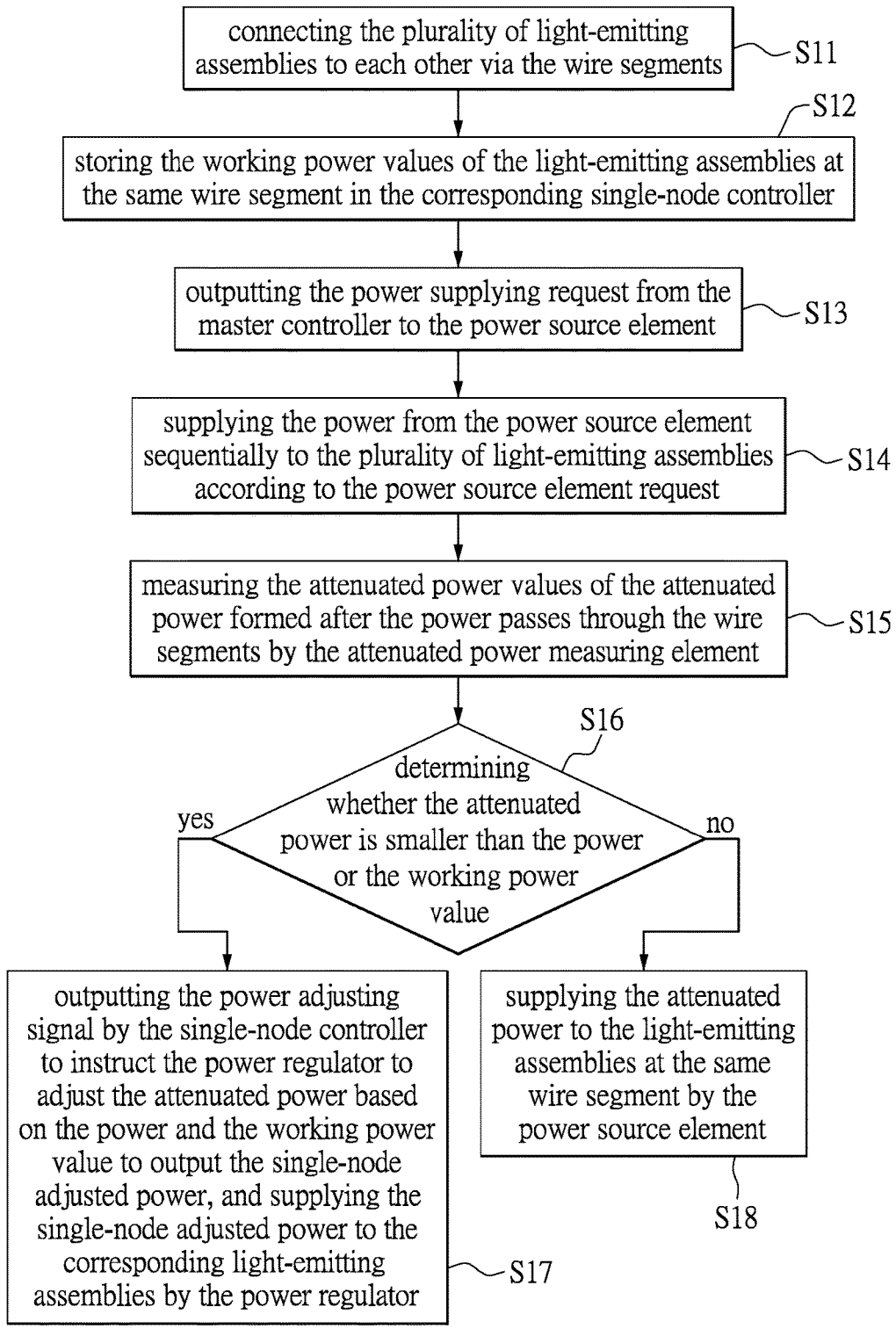
FIG. 7 is a flowchart of a second embodiment of a light string controlling method for single node according to the present disclosure.

Referring to FIG. 7, a flowchart of a second embodiment of a light string controlling method for single node according to the present disclosure is shown. As shown in FIG. 7, the light string controlling method includes the following steps S11 to S16.

In step S11, the plurality of light-emitting assemblies are connected to each other in series or in parallel via the wire segments.

In step S12, the single-node controller stores the working power values of the corresponding light-emitting assemblies at the same wire segments.

In step S13, the master controller outputs the power supplying request to the power source element.

In step S14, the power source element supplies the power to the plurality of the light-emitting assemblies sequentially based on the power supplying request.

In step S15, the attenuated power measuring elements measure the attenuated power formed after the power passes through the different wire segments.

In step S16, the single-node controller determines whether the attenuated power is smaller than the power and/or the working power of the light-emitting element. In step S17, when the attenuated power is smaller than the power and/or the working power values, the single-node controller outputs the power adjusting signal to instruct the power regulator to adjust the attenuated power based on the power and the working power value to output the single-node adjusted power, and the power regulator supplies the single-node adjusted power to the corresponding light-emitting assemblies to adjust the brightness of the light-emitting assemblies. Conversely, in step S18, when the attenuated power is not smaller than the power and/or the one or more working power values, the single-node controller supplies the attenuated power to the corresponding light-emitting assemblies.

In addition, in order to more accurately adjust the attenuated power such that the light string controlling circuit has a desirable lighting effect, the light string controlling method for a single node may further include the following steps: looking up the connection relationship between the corresponding light-emitting assemblies, the connection relationship between the light-emitting elements of the corresponding light-emitting assemblies, and the working power values and withstand power values from a database of the single-node controller by the single-node controller, and accordingly determining the common single-node power value for all of the corresponding light-emitting assemblies by the single-node controller; and using the single-node controller to determine, based on the common single-node power value, the degree of adjustment of the attenuated power before passing through the light-emitting assemblies by the power regulator.

In order to speed up future adjustments of the attenuated power by the light string controlling circuit after supplying the power, the light string controlling method for single node may further include the following steps: storing the current path length of the wire segments through which the power passes from the power source element to each of the corresponding light-emitting assemblies in the single-node controller; calculating the difference between the power and the attenuated power before the attenuated power passes through the light-emitting assemblies; analyzing the ratio of the current path length and the difference and accordingly estimating another attenuated power value of another attenuated power formed after another power that is the same or different from the power passes through the light-emitting assemblies. The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light string controlling circuit for single node, comprising:

a plurality of light-emitting assemblies connected to each other;

a power source element connected to the plurality of light-emitting assemblies, the power source element is configured to supply power sequentially to the plurality of light-emitting assemblies;

a master controller connected to the power source element, the master controller is configured to output a power supplying request to the power source element to instruct the power source element to supply the power; and a plurality of single-node controllers connected to the plurality of light-emitting assemblies respectively, each of the plurality of single-node controllers is configured to output an emission control signal for controlling each of the corresponding light-emitting assemblies.

2. The light string controlling circuit for single node of claim 1, wherein a number of the single-node controllers is less than that of the light-emitting assemblies, each of the plurality of single-node controllers controls the corresponding light-emitting assemblies to emit light having the same brightness, color, lighting time, frequency or any combination thereof.

3. The light string controlling circuit for single node of claim 1, further comprising: a plurality of a power regulators, the plurality of light-emitting assemblies are connected to each other via wire segments, each of the plurality of power regulators is connected to the single-node controller and the light-emitting assemblies at the same wire segment; when each of the plurality of single-node controllers determines that attenuated power formed after the power passes through the wire segments is smaller than a working power value stored in the single-node controller, the single-node controller outputs a power adjusting signal for instructing the power regulator to adjust the attenuated power based on the power and the working power value to output a single-node adjusted power to the corresponding light-emitting assemblies.

4. The light string controlling circuit for single node of claim 3, further comprising: at least one attenuated power measuring element connected to the plurality of single-node controllers, the attenuated power measuring element being configured to measure attenuated power values of the attenuated power formed after the power passes through the wire segments and to output the attenuated power values to the corresponding single-node controller, and the single-node controller being configured to calculate a difference between the power and the attenuated power.

5. The light string controlling circuit for single node of claim 3, wherein the single-node controller is configured to store a current path length of the wire segments through which the power passes from the power source element to each of the corresponding light-emitting assemblies, and calculate a difference between the power and the attenuated power before the attenuated power passes through the light-emitting assemblies, the single-node controller is configured to analyze a ratio of the current path length and the difference and accordingly estimate another attenuated power value of another attenuated power formed after another power that is the same or different from the power passing through the light-emitting assemblies.

6. The light string controlling circuit for single node of claim 3, wherein each of the plurality of light-emitting assemblies includes one or more light-emitting elements connected to each other, each of the single-node controllers is configured to look up a connection relationship between the corresponding light-emitting assemblies, a connection relationship between the light-emitting elements of the corresponding light-emitting assemblies, and the working power values and withstand power values from a database of the single-node controller, and accordingly determine a common single-node power value for all of the corresponding light-emitting assemblies;

the single-node controller determines, based on the common single-node power value, the degree of adjustment of the attenuated power before passing through the light-emitting assemblies by the power regulator.

7. A light string controlling method for single node, comprising the following steps:

outputting a power supplying request from a master controller to a power source element;

supplying power from the power source element sequentially to a plurality of light-emitting assemblies according to the power supplying request; and outputting a plurality of emission control signals respectively by a plurality of single-node controllers to control luminous states of the plurality of light-emitting assemblies.

8. The light string controlling method for single node of claim 7, further comprising the following steps: connecting the plurality of light-emitting assemblies to each other via wire segments; storing one or more working power values of the one or more light-emitting assemblies at the same wire segment of the wire in the corresponding single-node controller; measuring attenuated power values of attenuated power formed after the power passes through the wire segments by at least one attenuated power measuring element; and determining whether the attenuated power is smaller than the power supplied by the power source element or the working power value of each of the light-emitting elements at the same wire segment of the wire by the corresponding single-node controller; when determining that the attenuated power is not smaller than the power or the working power value, supplying the attenuated power to the light-emitting assemblies at the same wire segment of the wire by the power source element, and when determining that the attenuated power is not smaller than the power or the working power value, outputting a power adjusting signal by the single-node controller to instruct a power regulator to adjust the attenuated power based on the power and the working power value to output an single-node adjusted power, and supplying the single-node adjusted power to the corresponding light-emitting assemblies by the power regulator.

9. The light string controlling method for single node of claim 7, further comprising the following steps: storing a current path length of the wire segments through which the power passes from the power source element to each of the corresponding light-emitting assemblies in the single-node controller; calculating a difference between the power and the attenuated power before the attenuated power passes through the light-emitting assemblies;

analyzing a ratio of the current path length and the difference and accordingly estimating another attenuated power value of another attenuated power formed after another power that is the same or different from the power passing through the light-emitting assemblies.

10. The light string controlling method for single node of claim 7, further comprising the following steps: looking up a connection relationship between the corresponding light-emitting assemblies, a connection relationship between the light-emitting elements of the corresponding light-emitting assemblies, and the working power values and withstand power values from a database of the single-node controller by the single-node controller, and accordingly determining a common single-node power value for all of the corresponding light-emitting assemblies by the single-node controller; and using the single-node controller to determine, based on the common single-node power value, the degree of adjustment of the attenuated power before passing through the light-emitting assemblies by a power regulator.

* * * * *